United States Patent
Kim et al.

(10) Patent No.: US 12,085,595 B2
(45) Date of Patent: *Sep. 10, 2024

(54) READ-OUT CIRCUIT FOR A CAPACITIVE SENSOR

(71) Applicants: Gwanak Analog CO., LTD., Seoul (KR); Seoul National University R&DB Foundation, Seoul (KR)

(72) Inventors: Minsung Kim, Gwacheon-si (KR); Suhwan Kim, Seoul (KR); Hyunjoong Lee, Daejeon (KR)

(73) Assignees: Gwanak Analog CO., LTD, Seoul (KR); Seoul National University R&DB Foundation, Seoul (KR)

( * ) Notice: Subject to any disclaimer, the term of this patent is extended or adjusted under 35 U.S.C. 154(b) by 88 days.

This patent is subject to a terminal disclaimer.

(21) Appl. No.: 17/965,539

(22) Filed: Oct. 13, 2022

(65) Prior Publication Data
US 2023/0036880 A1   Feb. 2, 2023

Related U.S. Application Data

(63) Continuation of application No. PCT/KR2021/004970, filed on Apr. 21, 2021.

(30) Foreign Application Priority Data

Apr. 24, 2020   (KR) .................. 10-2020-0050392

(51) Int. Cl.
| | |
|---|---|
| G01R 27/26 | (2006.01) |
| H03F 3/45 | (2006.01) |
| G01D 5/24 | (2006.01) |

(52) U.S. Cl.
CPC ..... *G01R 27/2605* (2013.01); *H03F 3/45475* (2013.01); *G01D 5/24* (2013.01); *H03F 2203/45116* (2013.01)

(58) Field of Classification Search
CPC .. G01D 5/00; G01D 5/12; G01D 5/14; G01D 5/24; G01D 5/244; G01D 5/24471;
(Continued)

(56) References Cited

U.S. PATENT DOCUMENTS

| | | |
|---|---|---|
| 8,830,207 B1 | 9/2014 | Joharapurkar et al. |
| 9,244,569 B2 | 1/2016 | Guedon et al. |

(Continued)

FOREIGN PATENT DOCUMENTS

| | | |
|---|---|---|
| CN | 105808024 B | 7/2016 |
| CN | 109710101 A | 5/2019 |

(Continued)

*Primary Examiner* — Hoai-An D. Nguyen
(74) *Attorney, Agent, or Firm* — William Park & Associates Ltd.

(57) ABSTRACT

A read-out circuit includes an operational amplifier configured to receive input voltage via a positive input terminal; a feedback capacitor connected between an output terminal of the operational amplifier and a negative input terminal of the operational amplifier; a sensor charging/discharging circuit configured to charge or to discharge a sensor capacitor included in a sensor during a first time; and a switching circuit configured to connect the sensor capacitor and the operational amplifier during a second time after the sensor capacitor is charged or discharged.

14 Claims, 8 Drawing Sheets

(58) Field of Classification Search
CPC ...... G01D 5/2448; G01R 27/00; G01R 27/02;
G01R 27/26; G01R 27/2605; G01R
29/00; G01R 29/08; G01R 29/0864;
G01R 29/0871; H03F 3/00; H03F 3/45;
H03F 3/45071; H03F 3/45076; H03F
3/45475; H03F 3/70; H03F 2200/00;
H03F 2200/231; H03F 2200/252; H03F
2200/264; H03F 2203/00; H03F 2203/45;
H03F 2203/45512
USPC .................. 324/600, 649, 658, 676, 678
See application file for complete search history.

(56) References Cited

U.S. PATENT DOCUMENTS

| | | | |
|---|---|---|---|
| 9,952,728 | B2 * | 4/2018 | Hu .................. G06F 3/041661 |
| 10,025,441 | B2 | 7/2018 | Ryshtun et al. |
| 10,156,935 | B2 | 12/2018 | Lee et al. |
| 2012/0218222 | A1 | 8/2012 | Shen et al. |
| 2013/0278538 | A1 | 10/2013 | Brunet et al. |
| 2013/0307811 | A1 | 11/2013 | Hanssen et al. |
| 2017/0300148 | A1 | 10/2017 | Shimada |
| 2020/0110117 | A1 | 4/2020 | Jiang et al. |

FOREIGN PATENT DOCUMENTS

| | | | | |
|---|---|---|---|---|
| CN | 112965641 | B * | 9/2021 | ......... G01R 27/2605 |
| DE | 112018001005 | T5 | 11/2019 | |
| EP | 2187241 | B1 | 9/2018 | |
| EP | 3709514 | A1 | 9/2020 | |
| FR | 2756048 | A1 | 5/1998 | |
| JP | 2013150274 | A | 8/2013 | |
| KR | 1020150060565 | A | 6/2015 | |
| KR | 1020160020480 | A | 2/2016 | |
| KR | 101872368 | B1 | 6/2018 | |
| KR | 101909515 | B1 | 10/2018 | |

* cited by examiner

READ-OUT CIRCUIT FOR A CAPACITIVE SENSOR

CROSS-REFERENCE TO RELATED APPLICATIONS

The present application is a continuation of and claims priority to PCT application No. PCT/KR2021/004970, filed on Apr. 21, 2021, which claims priority to Korean Patent Application No. 10-2020-0050392, filed on Apr. 24, 2020, which is incorporated herein by reference in its entirety.

BACKGROUND

1. Technical Field

Embodiments relate to a read-out circuit for a capacitive sensor, and more particularly, to a read-out circuit for detecting a change in capacitance of a capacitive sensor including a capacitor.

2. Related Art

With the advent of the era of the Internet of Things, research and development on various smart devices and sensors are in progress.

In a capacitive sensor that senses the change of capacitance of a capacitor, a read-out circuit includes a circuit that converts the change of capacitance into a voltage signal.

When a terminal of the capacitor is grounded in the capacitive sensor, noise may be introduced through the terminal, making it difficult to generate an accurate signal.

SUMMARY

In accordance with an embodiment of the present disclosure, a read-out circuit may include an operational amplifier configured to receive input voltage via a positive input terminal; a feedback capacitor connected between an output terminal of the operational amplifier and a negative input terminal of the operational amplifier; a sensor charging/discharging circuit configured to charge or to discharge a sensor capacitor included in a sensor during a first time; and a switching circuit configured to connect the sensor capacitor and the operational amplifier during a second time after the sensor capacitor is charged or discharged.

In accordance with an embodiment of the present disclosure, a read-out circuit may include an operational amplifier configured to receive input voltage via a positive input terminal; a feedback capacitor connected between an output terminal of the operational amplifier and a negative input terminal of the operational amplifier; a sensor charging/discharging circuit configured to charge or to discharge a sensor capacitor during a first time; an offset removal circuit including an offset capacitor connected between a first node and a second node and configured to charge or discharge the offset capacitor during the first time; a first switching circuit configured to provide a power supply voltage of a ground voltage to the first node during the first time; and a second switching circuit configured to connect the operational amplifier and the offset removal circuit and to connect the offset removal circuit and the sensor capacitor during the second time after the sensor capacitor is charged or discharged.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
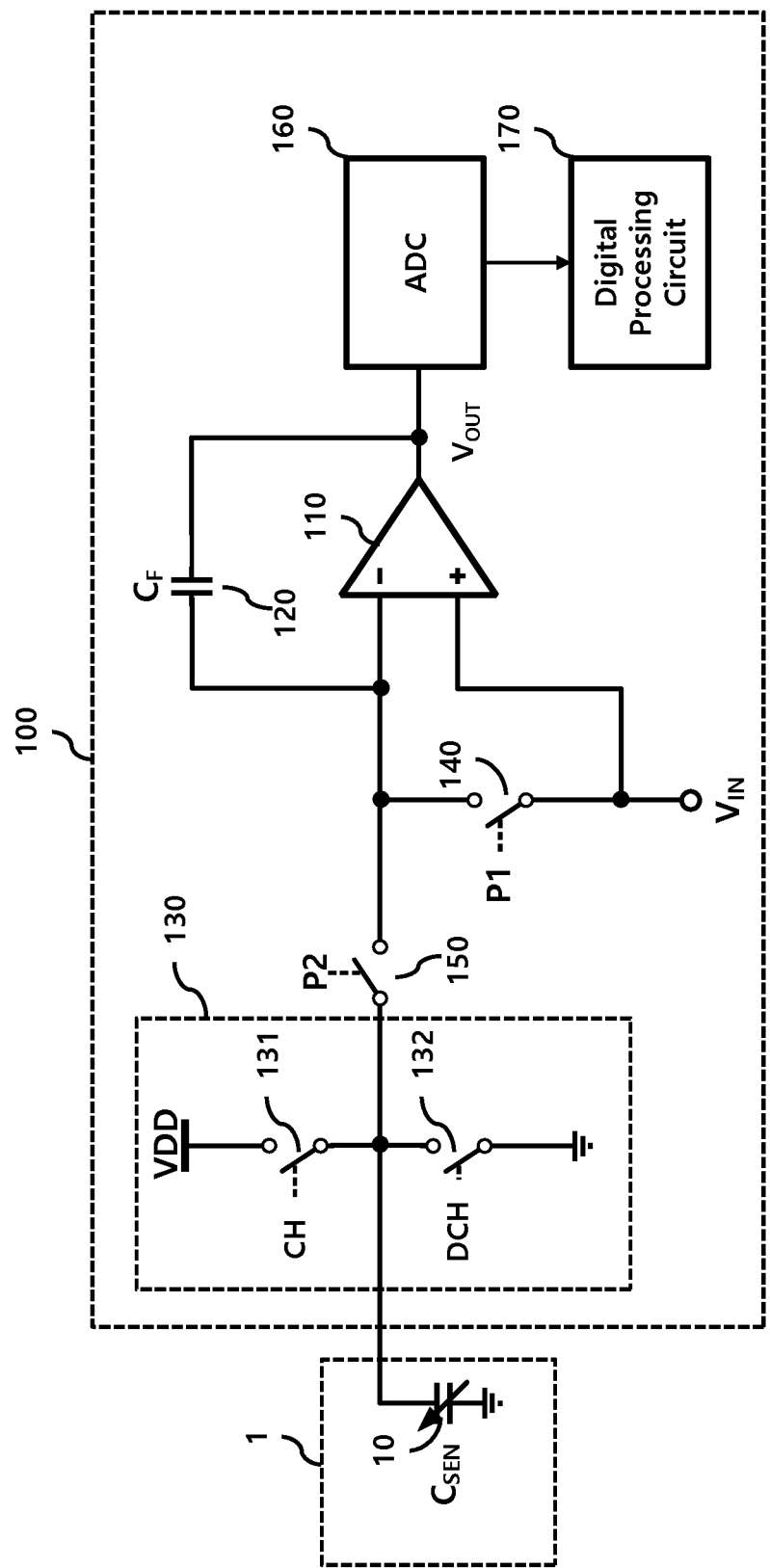
FIG. 1 illustrates a read-out circuit according to an embodiment of the present disclosure.

FIG. 1 is a circuit diagram illustrating a read-out circuit 100 according to an embodiment of the present disclosure.

The read-out circuit 100 according to an embodiment of the present disclosure detects change in capacitance of a capacitor 10 included in a capacitive sensor 1 and generates an output voltage $V_{OUT}$ corresponding thereto.

Hereinafter, the capacitor 10 is referred to as a sensor capacitor 10. One terminal of the sensor capacitor 10 is grounded.

The read-out circuit 100 includes an operational amplifier 110 and a feedback capacitor 120.

The feedback capacitor 120 is connected between the output terminal of the operational amplifier 110 and a negative input terminal of the operational amplifier 110.

An input voltage $V_{IN}$ is provided to a positive input terminal of the operational amplifier 110.

The read-out circuit 100 includes a sensor charging/discharging circuit 130, a first switching circuit 140, and a second switching circuit 150.

The sensor charging/discharging circuit 130 includes a charging switch 131 for charging the sensor capacitor 10 by applying a power supply voltage VDD to the other node of the sensor capacitor 10 and a discharging switch 132 for discharging the sensor capacitor 10 by grounding the other terminal of the sensor capacitor 10.

The charging switch 131 is controlled according to a charging control signal CH, and the discharging switch 132 is controlled according to a discharging control signal DCH.

The first switching circuit 140 connects the positive input terminal and the negative input terminal of the operational amplifier 110 according to a first switching signal P1.

The second switching circuit 150 connects the other terminal of the sensor capacitor 10 and the negative input terminal of the operational amplifier 110 according to a second switching signal P2.

Figure 2:
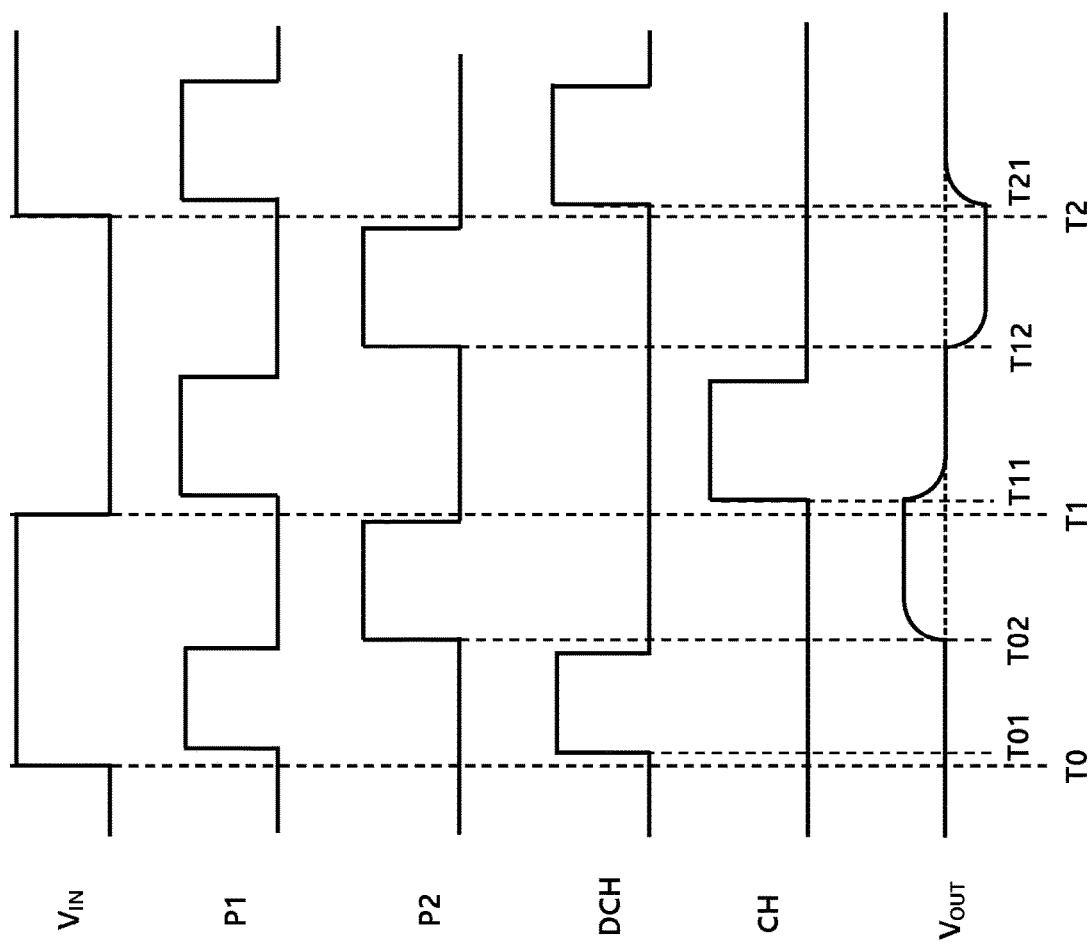
FIG. 2 illustrates a timing diagram showing an operation of a read-out circuit according to an embodiment of the present disclosure.

FIG. 2 is a timing diagram illustrating an operation of the read-out circuit 100 according to an embodiment of the present disclosure.

As for the input voltage $V_{IN}$, a high level voltage is applied between T0 and T1 and a low level voltage is applied between T1 to T2.

In this embodiment, the high level corresponds to the power supply voltage VDD and the low level corresponds to the ground voltage.

First, an operation when the input voltage $V_{IN}$ is at the high level will be described.

After the input voltage $V_{IN}$ becomes the high level at T0, the discharging control signal DCH becomes the high level at T01 to turn on the discharge switch 132, thereby discharging the sensor capacitor 10.

The first switching signal P1 becomes the high level at substantially the same time as the discharging control signal DCH. Accordingly, the positive input terminal and the negative input terminal of the operational amplifier 110 are set to the same voltage according to the first switching circuit 140.

Thereafter, the discharging control signal DCH becomes the low level to turn off the discharge switch 132. In addition, the first switching signal P1 also becomes the low level at substantially the same time, so that the positive input terminal and the negative input terminal of the operational amplifier 110 are separated.

Thereafter, when the second switching signal P2 becomes the high level at T02, the second switching circuit 150 is turned on to generate an output voltage $V_{OUT}$.

The amount of change of the output voltage $V_{OUT}$ after T02 may be calculated using the charge conservation law like the following Equation 1.

$$\Delta V_{OUT,High} = VDD\left(\frac{C_{SEN}}{C_F}\right) \quad \text{[Equation 1]}$$

Next, an operation when the input voltage $V_{IN}$ is at the low level will be described.

After the input voltage $V_{IN}$ becomes the low level at T1, the charging control signal CH becomes the high level at T11, and the charging switch 131 is turned on to charge the sensor capacitor 10 accordingly.

The first switching signal P1 becomes the high level at substantially the same time as the charging control signal CH. Accordingly, the positive input terminal and the negative input terminal of the operational amplifier 110 are set to the same voltage according to the first switching circuit 140.

Thereafter, the charging control signal CH becomes the low level to turn off the charging switch 131. In addition, the first switching signal P1 also becomes the low level at substantially the same time, so that the positive input terminal and the negative input terminal of the operational amplifier 110 are separated.

Thereafter, when the second switching signal P2 becomes the high level at T12, the second switching circuit 150 is turned on to generate the output voltage $V_{OUT}$.

The amount of change in the output voltage $V_{OUT}$ after T12 may be calculated using the charge conservation law like the following Equation 2.

$$\Delta V_{OUT,Low} = -VDD\left(\frac{C_{SEN}}{C_F}\right) \quad \text{[Equation 2]}$$

Equation 3 can be derived from Equations 1 and 2.

$$\Delta V_{OUT,High} - \Delta V_{OUT,Low} = 2VDD\left(\frac{C_{SEN}}{C_F}\right) \quad \text{[Equation 3]}$$

As shown in Equation 3, when capacitance of the sensor capacitor 10 is measured from the difference in the amount of change of the output voltage $V_{OUT}$. It is possible to cancel the effect of noise applied from a voltage source providing the power supply voltage and the ground voltage.

The read-out circuit 100 may further include an analog-to-digital converter (ADC) 160 that converts the output voltage $V_{OUT}$ of the operational amplifier 110 into a digital signal, and a digital processing circuit 170 that processes the digital signal output from the ADC 160.

The ADC 160 may convert the output voltage $V_{OUT}$ into the digital signal, for example, when the first switching signal P1 transitions to the low level and when the second switching signal P2 transitions to the low level.

The digital processing circuit 170 may calculate the difference between the two output voltages to measure the amount of change in the output voltage $V_{OUT}$, and accordingly, the values corresponding to Equations 1 and 2 may be obtained. Thereafter, a value corresponding to Equation 3 may be obtained through an additional operation.

Figure 3:
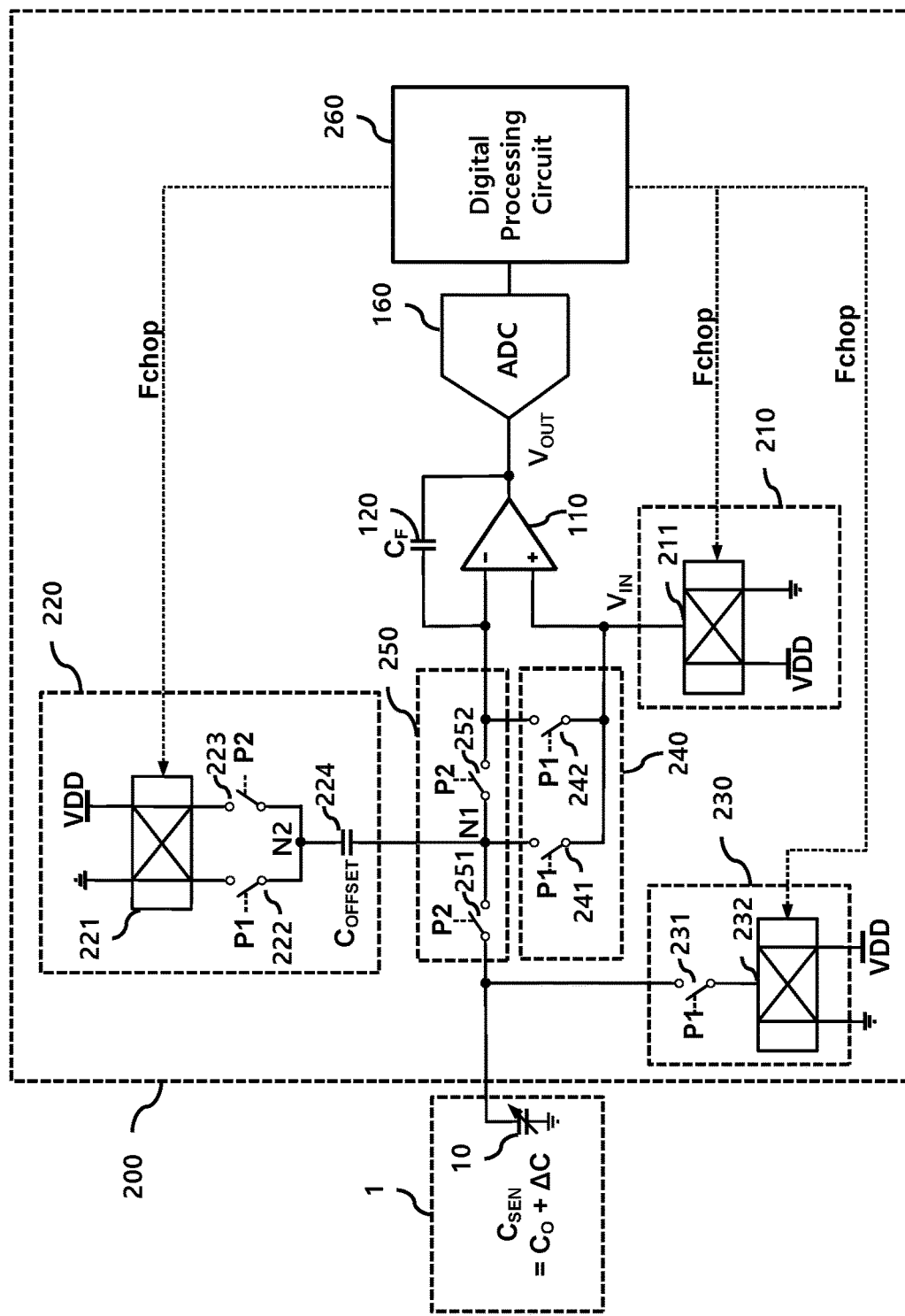
FIG. 3 illustrates a read-out circuit according to another embodiment of the present disclosure.

FIG. 3 is a circuit diagram illustrating a read-out circuit 200 according to another embodiment of the present disclosure.

The read-out circuit 200 corresponds to the sensor capacitor 10 included in the sensor 1 includes offset capacitance.

The capacitance $C_{SEN}$ of the sensor capacitor 10 may be expressed as the sum of the offset capacitance $C_O$ and variable capacitance $\Delta C$.

The offset capacitance $C_O$ is kept to a constant value regardless of the sensing operation, and the variable capacitance $\Delta C$ varies according to a sensing operation.

Since the sensing result is affected by the variable capacitance $\Delta C$, when the offset capacitance $C_O$ is not 0, the difference in the output voltages in Equation 3 is not expressed purely according to the variable capacitance $\Delta C$, so correction for removing the offset capacitance $C_O$ is required for accurate sensing.

The embodiment of FIG. 3 provides the read-out circuit 200 that does not require an additional correction operation by removing the effect of the offset capacitance $C_O$.

In this embodiment, the read-out circuit 200 includes an operational amplifier 110 and a feedback capacitor 120.

The feedback capacitor 120 is connected between the output terminal and the negative input terminal of the operational amplifier 110.

The input voltage $V_{IN}$ is provided to the positive input terminal of the operational amplifier 110.

The read-out circuit 200 further includes a voltage input circuit 210, an offset removal circuit 220, a sensor charging/discharging circuit 230, a first switching circuit 240 and a second switching circuit 250, an ADC 160 and a digital processing circuit 260.

The voltage input circuit 210 includes a first power switching circuit 211 that provides the power supply voltage VDD or the ground voltage as the input voltage $V_{IN}$ according to the power switching signal Fchop.

The first power switching circuit 211 provides the power supply voltage VDD as the input voltage $V_{IN}$ when the power switching signal Fchop is at the high level, and applies the ground voltage to the input voltage $V_{IN}$ when the power switching signal Fchop is at the low level.

The offset removal circuit 220 includes a second power switching circuit 221, switches 222 and 223, and an offset capacitor 224.

The offset capacitor 224 is connected between a first node N1 and a second node N2.

One terminal of each of the switches 222 and 223 is connected to the second power switching circuit 221, and the other terminals of the switches 222 and 223 are commonly connected to the second node N2.

The switch 222 is turned on and off according to the first switching signal P1 and the switch 223 is turned on and off according to the second switching signal P2.

The second power switching circuit 221 provides the ground voltage to one terminal of the switch 222 and the power supply voltage VDD to one terminal of the switch 223 when the power switching signal Fchop is at the high level.

Also, when the power switching signal Fchop is at the low level, the second power switching circuit 221 provides the power supply voltage to one terminal of the switch 222 and the ground voltage to one terminal of the switch 223.

The sensor charging/discharging circuit 230 includes a switch 231 and a third power switching circuit 232.

One terminal of the switch 231 is connected to the sensor 1 through the input terminal of the read-out circuit 200, and the other terminal is connected to the third power switching circuit 232.

The switch 231 is turned on and off according to the first switching signal P1.

The third power switching circuit 232 provides the ground voltage to the other terminal of the switch 231 when the power switching signal Fchop is at the high level, and provides the power supply voltage to the other terminal of the switch 231 when the power switching signal Fchop is at the low level.

The first switching circuit 240 includes a switch 241 connected between the first node N1 and the positive input terminal of the operational amplifier 110 and a switch 242 connected between the positive input terminal and the negative input terminal of the operational amplifier 110. The switches 241 and 242 are turned on and off according to the first switching signal P1.

The second switching circuit 250 further includes a switch 251 connected between the sensor 1 and the first node N1 and a switch 252 connected between the first node N1 and the negative input terminal of the operational amplifier 110. The switches 251 and 252 are turned on and off according to the second switching signal P2.

The ADC 160 converts the output voltage $V_{OUT}$ provided from the operational amplifier 110 into a digital signal.

The digital processing circuit 260 performs a signal processing operation using the digital signal output from the ADC 160.

In addition, the digital processing circuit 260 outputs the power switching signal Fchop to control the first to third power switching circuits 211, 221, and 232.

Figure 4:
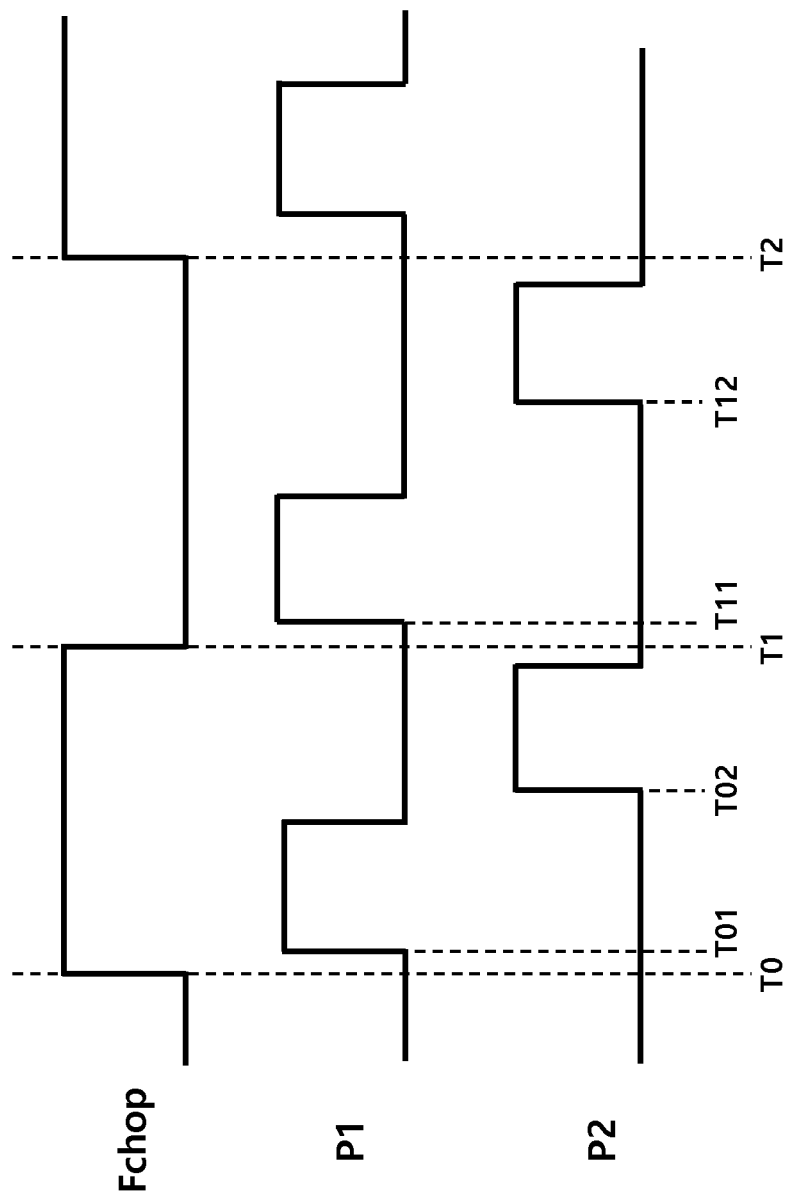
FIG. 4 illustrates a timing diagram showing an operation of a read-out circuit according to another embodiment of the present disclosure.

FIG. 4 is a timing diagram illustrating an operation of the read-out circuit 200 of FIG. 3.

The power switching signal Fchop has the high level between T0 and T1 and the low level between T1 and T2.

First, an operation when the power switching signal Fchop is at the high level will be described.

According to the operation of the first power switching circuit 211, the input voltage $V_{IN}$ has the high level, that is, the power supply voltage VDD.

After the power switching signal Fchop becomes the high level at T0, the first switching signal P1 becomes the high level, the switch 231 is turned on, and the ground voltage provided from the third power switching circuit 232 is applied to the sensor 1 to discharge the sensor capacitor 10 at T01.

At this time, the switch 241 is turned on to apply a power supply voltage VDD to the first node N1, and a ground voltage provided through the second power switching circuit 221 is provided to the second node N2 through the switch 222.

Hereinafter, it is expressed that the offset capacitor 224 is charged in a positive direction when positive charge is charged in the first node N1, and that the offset capacitor 224 is charged in a negative direction when negative charge is charged in the first node N1.

Accordingly, the sensor capacitor 10 is discharged and the offset capacitor 224 is charged in the positive direction.

In addition, since the switch 242 is turned on, the positive input terminal and the negative input terminal of the operational amplifier 110 are set to have the same voltage.

Thereafter, the first switching signal P1 becomes the low level to turn off the switches 222, 231, 241, and 242, and then at T02, the second switching signal P2 becomes the high level to turn on the switches 251 and 252.

In this case, the power supply voltage VDD provided through the second power switching circuit 221 is provided to the second node N2 through the switch 223.

Accordingly, the charge charged in the offset capacitor 224 is transferred to the sensor capacitor 10 and the feedback capacitor 120.

The amount of change in the output voltage $V_{OUT}$ after T02 may be calculated using the charge conservation law like the following Equation 4.

$$\Delta V_{OUT,High} = VDD\left(\frac{(\Delta C + Co) - C_{OFFSET}}{C_F}\right) \quad \text{[Equation 4]}$$

The ADC 160 may convert the output voltage $V_{OUT}$ into a digital signal, for example, when the first switching signal P1 transitions to the low level and when the second switching signal P2 transitions to the low level.

The digital processing circuit 260 may calculate the amount of change in the output voltage $V_{OUT}$ as shown in Equation 4.

Next, an operation when the power switching signal Fchop is at the low level will be described.

According to the operation of the first power switching circuit 211, the input voltage $V_{IN}$ has the low level, that is, the ground voltage.

After the power switching signal Fchop and the input voltage $V_{IN}$ become the low level at T1, the first switching signal P1 becomes the high level at T11, the switch 231 is turned on, and the third power switching circuit 232 provides the power supply voltage VDD to the sensor 1 to charge the sensor capacitor 10.

At this time, the switch 241 is turned on to apply the ground voltage to the first node N1, and the power voltage VDD provided through the second power switching circuit 221 is provided to the second node N2 through the switch 222.

Accordingly, the sensor capacitor 10 is charged, and the offset capacitor 224 is also charged in a negative direction.

In addition, since the switch 242 is turned on, the positive input terminal and the negative input terminal of the operational amplifier 110 are set to have the same voltage.

Thereafter, the first switching signal P1 becomes the low level to turn off the switches 222, 231, 241, and 242, and then at T12, the second switching signal P2 becomes the high level to turn on the switches 251 and 252.

At this time, the ground voltage provided through the second power switching circuit 221 is provided to the second node N2 through the switch 223, and the charge charged in the offset capacitor 224 is provided to the first node N1.

The amount of change in the output voltage $V_{OUT}$ after T12 may be calculated using the charge conservation law like the following Equation 5.

$$\Delta V_{OUT,Low} = -VDD\left(\frac{(\Delta C + Co) - C_{OFFSET}}{C_F}\right) \quad \text{[Equation 5]}$$

The ADC 160 may convert the output voltage $V_{OUT}$ into a digital signal, for example, when the first switching signal P1 transitions to the low level and when the second switching signal P2 transitions to the low level.

The digital processing circuit 260 may calculate the amount of change in the output voltage $V_{OUT}$ as shown in Equation 5.

Before starting the sensing operation, capacitance of the offset capacitor 224 corresponds to the offset capacitance Co of the sensor capacitor 10.

The capacitance $C_{OFFSET}$ of the offset capacitor 224 may be predetermined to be equal to the offset capacitance Co.

In this case, since the value of Co–$C_{OFFSET}$ becomes 0, Equation 6 is derived from Equations 4 and 5.

$$\Delta V_{OUT,High} - \Delta V_{OUT,Low} = 2VDD\left(\frac{\Delta C}{C_F}\right) \quad \text{[Equation 6]}$$

The digital processing circuit 260 may calculate a difference in the amount of change in the output voltage $V_{OUT}$ as shown in Equation 6.

As shown in Equation 6, the capacitance of the sensor capacitor 10 is measured from the difference in the amount of change between the output voltage $V_{OUT}$ when the input voltage $V_{IN}$ is at the high level and the output voltage when the input voltage $V_{IN}$ is at the low level. Thereby, it is possible to cancel noise included in the input voltage $V_{IN}$ and noise applied from a power source providing the power supply voltage and the ground voltage.

As aforementioned, the capacitance $C_{OFFSET}$ of the offset capacitor 224 must be set equal to the offset capacitance Co of the sensor capacitor 10. Therefore, it may be difficult to physically implement the offset capacitor 224 when the offset capacitance of the sensor capacitor 10 is large.

Figure 5:
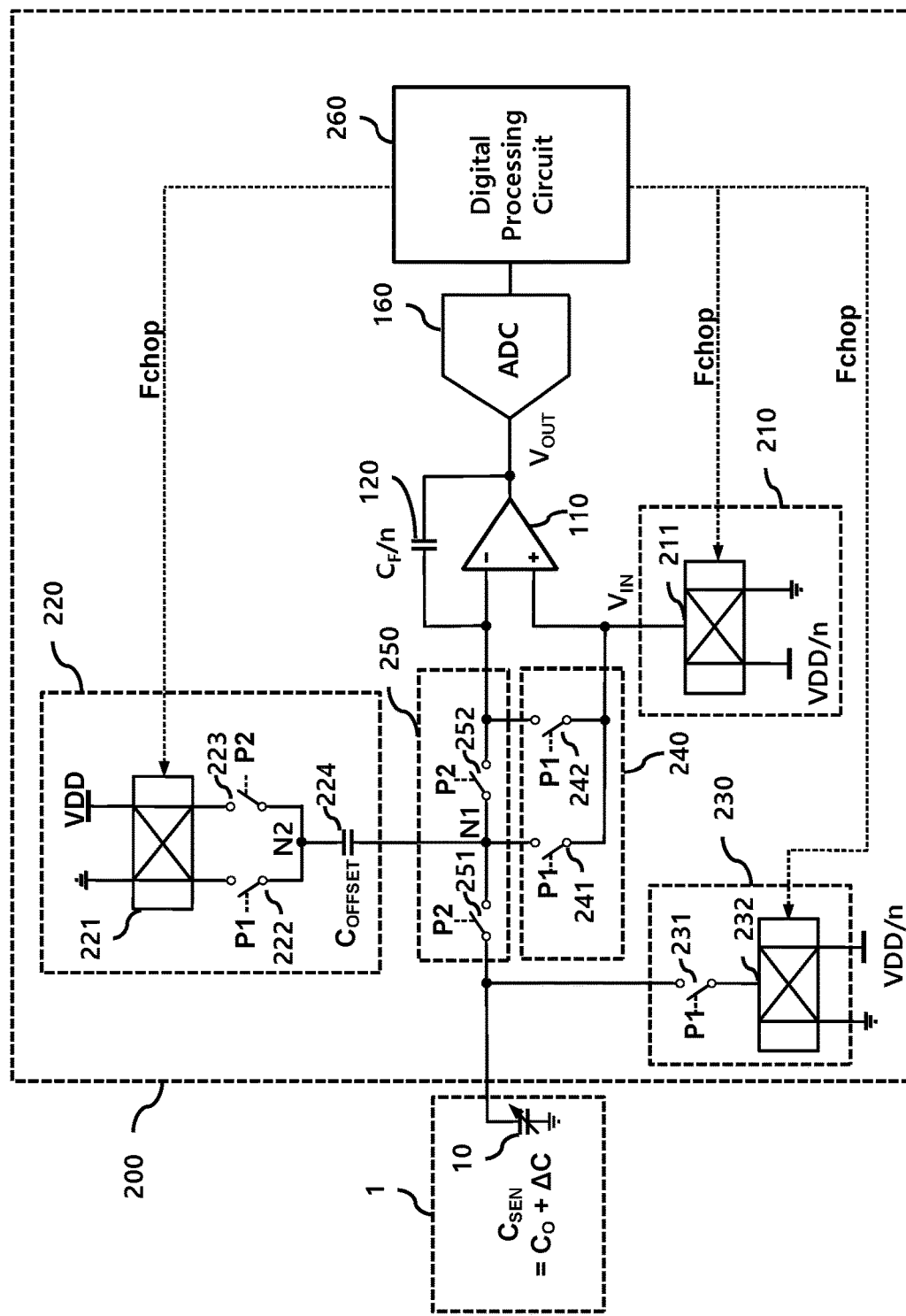
FIGS. 5, 6, and 7 illustrate read-out circuits according to other embodiments of the present disclosure.

As shown in FIG. 5, when the power supply voltage provided to the first power switching circuit 211 and the third power switching circuit 232 and the capacitance of the feedback capacitor 120 are reduced by 1/n times compared to those in FIG. 3, Equations 4 and 5 is transformed as Equations 7 and 8, where n is a real number greater than 1.

$$\Delta V_{OUT,High} = VDD\left(\frac{(\Delta C + Co) - nC_{OFFSET}}{C_F}\right) \quad \text{[Equation 7]}$$

$$\Delta V_{OUT,Low} = -VDD\left(\frac{(\Delta C + Co) - nC_{OFFSET}}{C_F}\right) \quad \text{[Equation 8]}$$

Equations 7 and 8 represent that capacitance of the offset capacitor 224 is increased by n times compared to the capacitance $C_{OFFSET}$ of the offset capacitor 224 in FIG. 3. Accordingly, the capacitance of the offset capacitor 224 may be reduced by 1/n of the offset capacitance Co.

Figure 6:
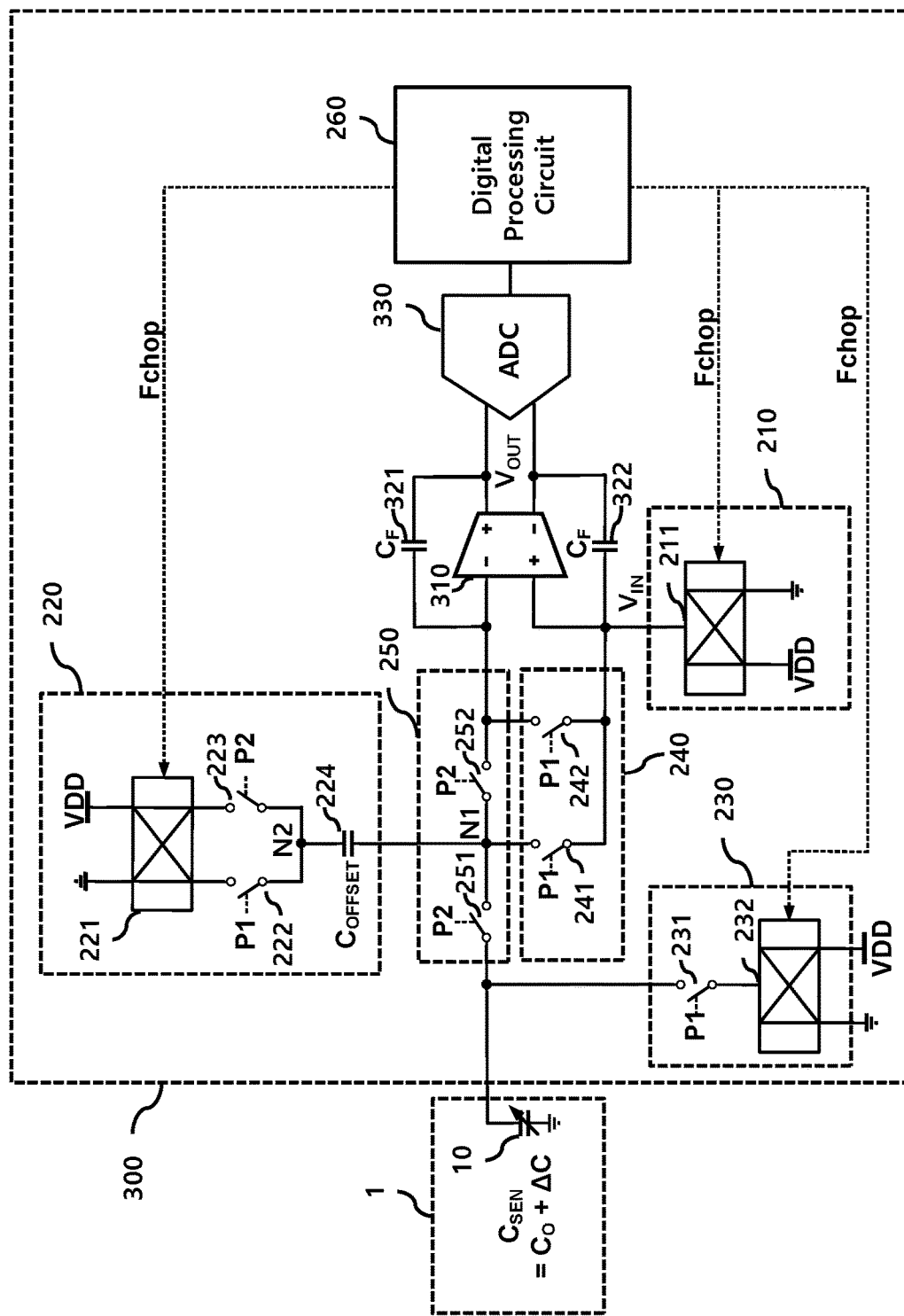

FIG. 6 is a circuit diagram illustrating a read-out circuit 300 according to another embodiment of the present disclosure.

The read-out circuit 300 of FIG. 6 includes a differential operational amplifier 310, a differential ADC 330, and two feedback capacitors 321 and 322.

The feedback capacitor 321 is connected between the negative input terminal and a positive output terminal of the operational amplifier 310, and the feedback capacitor 322 is connected between the positive input terminal and a negative output terminal of the operational amplifier 310.

It is well known that when a differential circuit is used, signal-to-noise ratio (SNR) characteristic can be improved by reducing noise of the amplifier and increasing magnitude of the output signal.

Except for this, the rest of the configuration and operation are substantially the same as those of the read-out circuit 200 of FIG. 3, therefore a repetitive description will be omitted.

Figure 7:
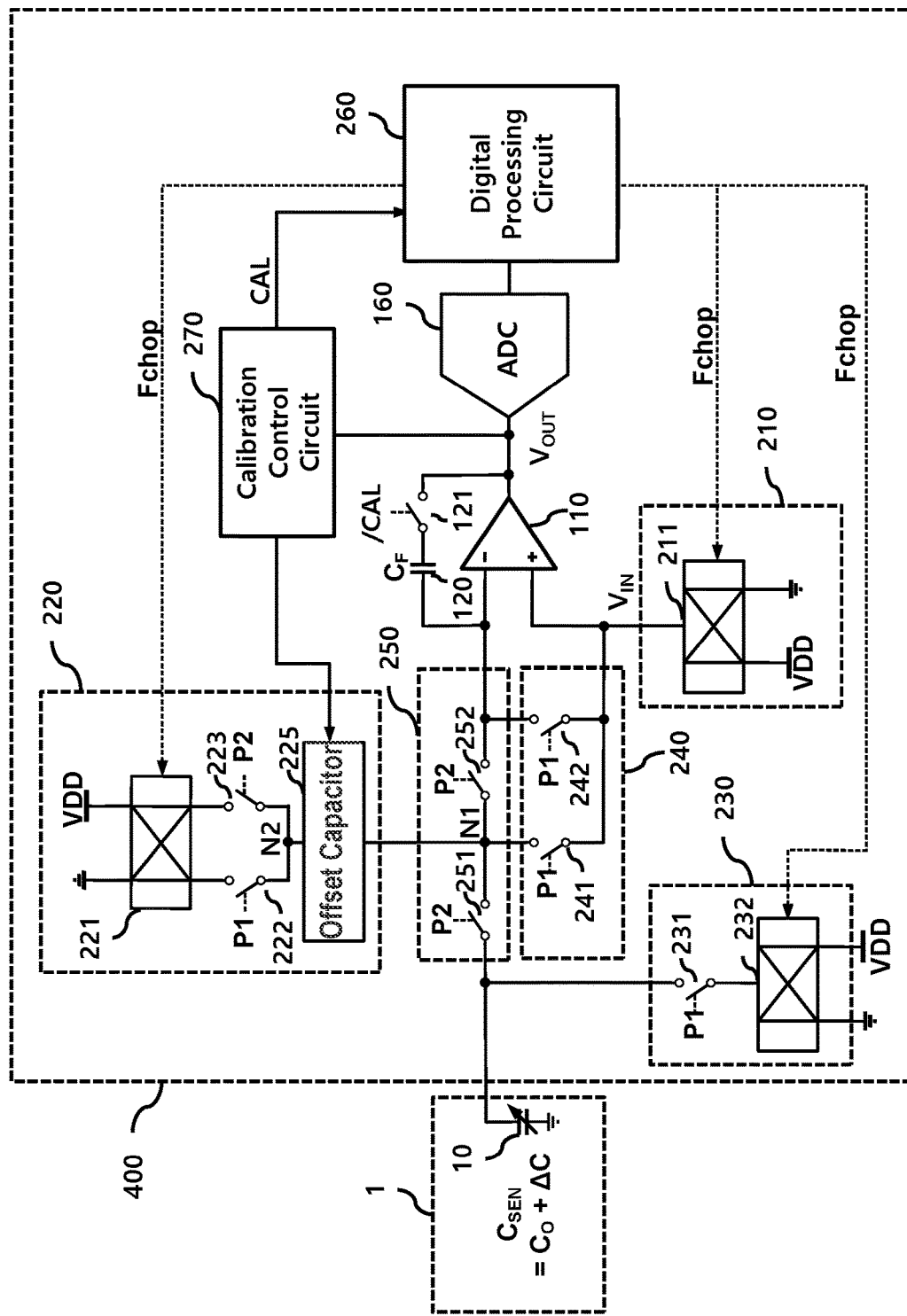

FIG. 7 is a circuit diagram illustrating a read-out circuit 400 according to another embodiment of the present disclosure.

The read-out circuit 400 of FIG. 7 further includes a calibration control circuit 270 that performs a calibration operation.

In this case, capacitance of the offset capacitor 225 may be adjusted according to the control of the calibration control circuit 270.

Figure 8:
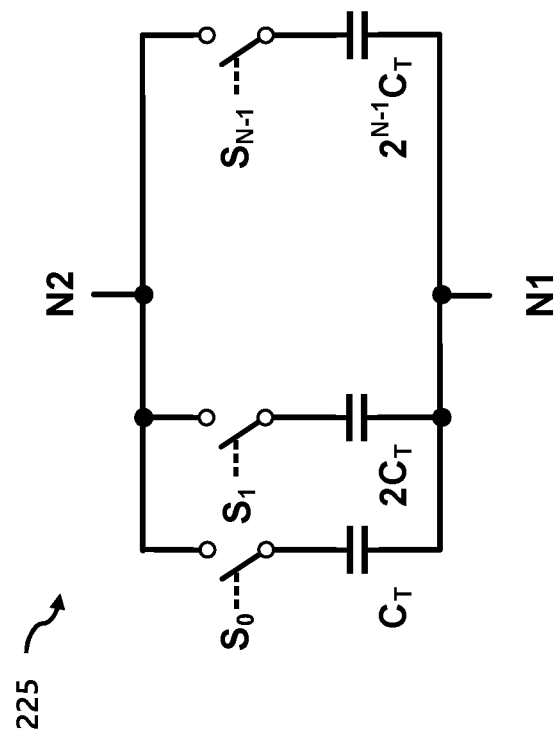
FIG. 8 illustrates a circuit diagram of an offset capacitor according to an embodiment of the present disclosure.

FIG. 8 is a circuit diagram illustrating a detailed configuration of the offset capacitor 225.

In this embodiment, the offset capacitor 225 includes N capacitors whose capacitance is multiplied by two times, and these are connected between the first node N1 and the second node N2 through a plurality of switches. For example, capacitance of the leftmost capacitor is $C_T$, capacitance of the second leftmost capacitor is $2C_T$, and capacitance of the rightmost capacitor is $2^{N-1}C_T$, where N is a natural number equal to or greater than 2.

A plurality of switches are controlled according to the control bits $S_0, S_1, \ldots, S_{N-1}$ provided from the calibration control circuit 270.

In FIG. 7, the read-out circuit 400 further includes a feedback connection switch 121. The feedback connection switch 121 blocks the feedback path of the operational amplifier 110 when the calibration signal CAL is activated.

Accordingly, during the calibration operation, the operational amplifier 100 operates like a comparator.

The calibration operation may be performed before the sensing operation.

In this case, the variable capacitance $\Delta C$ is 0 and the capacitance of the sensor capacitor 10 corresponds to the offset capacitance $C_O$.

In the present embodiment, the calibration control circuit 270 determines state of a switch included in the offset capacitor 225 according to a successive approximation method.

The calibration control circuit 270 sequentially determines values from the uppermost bit $S_{N-1}$ to the lowermost bit $S_0$.

For example, method of determining the value of $S_{N-1}$ is as follows.

First, the calibration control circuit 270 sets $S_{N-1}$ to the high level and sets all of $S_0$ to $S_{N-2}$ to the low level.

During the calibration operation, the power switching signal Fchop is fixed to the low level.

That is, the input voltage $V_{IN}$ is fixed to the ground voltage, the second power switching circuit 221 provides the power supply voltage VDD to the switch 222 and the ground voltage to the switch 223, and the third power switching circuit 232 provides the power supply voltage VDD to the switch 231.

In this state, as in T1 to T2 of FIG. 4, the first switching signal P1 and the second switching signal P2 are sequentially turned on.

When the first switching signal P1 is turned on, the sensing capacitor 10 is charged according to the power supply voltage.

In addition, the ground voltage is provided to the first node N1 and the power supply voltage is provided to the second node N2, so that the offset capacitor 225 is charged in a negative direction.

Afterwards, when the first switching signal P1 becomes the low level and the second switching signal P2 becomes the high level, the ground voltage is applied to the second node N2 and the sensing capacitor 10 and the offset capacitor 225 is commonly connected to the first node N1.

When the capacitance of the sensing capacitor 10 is larger, the voltage of the first node N1 becomes a positive voltage, so that the operational amplifier 110 outputs the ground voltage, that is, the low-level signal.

Conversely, when the capacitance of the currently set offset capacitor 225 is larger, the voltage of the first node N1 becomes a negative voltage, and the operational amplifier 110 outputs the power supply voltage VDD, that is, the high-level signal.

When the output voltage $V_{OUT}$ is at the low level, the calibration control circuit 270 determines the $S_{N-1}$ value as the high level, and otherwise determines the $S_{N-1}$ as the low level.

Thereafter, by repeating the calibration operation for the lower bits in the same manner, the capacitance $C_{OFFSET}$ of the offset capacitor 225 may be determined to be substantially the same as the offset capacitance Co of the sensor capacitor 10.

When the calibration operation is completed, the sensing operation may be performed as described above, and description thereof will not be repeated.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A read-out circuit comprising:
    an operational amplifier configured to receive input voltage via a positive input terminal;
    a feedback capacitor connected between an output terminal of the operational amplifier and a negative input terminal of the operational amplifier;
    a sensor charging/discharging circuit configured to charge or to discharge a sensor capacitor during a first time;
    an offset removal circuit including an offset capacitor connected between a first node and a second node and configured to charge or discharge the offset capacitor during the first time;
    a first switching circuit configured to provide a power supply voltage or a ground voltage to the first node during the first time; and
    a second switching circuit configured to connect the operational amplifier and the offset removal circuit and to connect the offset removal circuit and the sensor capacitor during the second time after the sensor capacitor is charged or discharged.

2. The read-out circuit of claim 1, further comprising a calibration control circuit configured to set capacitance of the offset capacitor as capacitance of the sensor capacitor according to output of the operational amplifier during a calibration operation.

3. The read-out circuit of claim 2, further comprising a switch configured to disconnect the feedback capacitor from the operational amplifier during the calibration operation.

4. The read-out circuit of claim 2, wherein when the calibration operation is performed, the input voltage is fixed to the ground voltage, the power supply voltage is provided to the sensor capacitor and the second node and the ground voltage is provided to the first node during the first time, and the ground voltage is provided to the second node during the second time.

5. The read-out circuit of claim 4, wherein the calibration control circuit adjusts capacitance of the offset capacitor according to output of the operational amplifier after the second time.

6. The read-out circuit of claim 1, wherein the first switching circuit further includes a switching circuit configured to connect the negative input terminal and a positive input terminal of the operational amplifier during the first time.

7. The read-out circuit of claim 1, further comprising an analog-to-digital converter (ADC) configured to convert output of the operational amplifier into a digital signal, and a digital processing circuit configured to perform an operation using the digital signal.

8. The read-out circuit of claim 1, wherein the offset removal circuit controls voltage provided to the second node during the first time to be different from voltage provided to the second node during the second time.

9. The read-out circuit of claim 8, further comprising a first power switching circuit configured to provide the power supply voltage or the ground voltage as the input voltage according to a power switching signal,
    wherein the offset removal circuit further comprises a second power switching circuit configured to select the power supply voltage or the ground voltage according to the power switching signal, and
    wherein the sensor charging/discharging circuit further comprises a third power switching circuit configured to select the power supply voltage or the ground voltage according to the power switching signal.

10. The read-out circuit of claim 9, wherein capacitance of the offset capacitor is set as offset capacitance of the sensor capacitor.

11. The read-out circuit of claim 10, wherein when capacitance of the offset capacitor is reduced by 1/n times, magnitude of the power supply voltage selected at the first power switching circuit and the third switching circuit is reduced by 1/n times and capacitance of the feedback capacitor is reduced by 1/n times.

12. The read-out circuit of claim 9, wherein when the power switching signal is at the high level, the first power switching circuit selects the power supply voltage as the input voltage, the offset removal circuit provides the ground voltage to the second node, the first switching circuit provides the power supply voltage to the first node, and the sensor charging/discharging circuit provides the ground voltage to the sensor capacitor during the first time, and the offset removal circuit provides the power supply voltage to the second node during the second time.

13. The read-out circuit of claim 9, wherein when the power switching signal is at the low level, the first power switching circuit selects the ground voltage as the input voltage, the offset removal circuit provides the power supply voltage to the second node, the first switching circuit provides the ground voltage to the first node, and the sensor charging/discharging circuit provides the power supply voltage to the sensor capacitor during the first time, and the offset removal circuit provides the ground voltage to the second node during the second time.

14. The read-out circuit of claim 1, wherein the operational amplifier includes a positive output terminal and a negative output terminal, the feedback capacitor is connected between the positive output terminal and the negative input terminal, and the read-out circuit further includes another feedback capacitor connected between the negative output terminal and the positive input terminal.

\* \* \* \* \*